United States Patent
Tang

(10) Patent No.: US 9,645,921 B2
(45) Date of Patent: May 9, 2017

(54) START-UP METHOD FOR USB FLASH DISK WITH SYNCHRONOUS FLASH MEMORY AND CONTROL SYSTEM

(71) Applicant: IPGoal Microelectronics (Sichuan) Co., Ltd., Chengdu (CN)

(72) Inventor: Jian Tang, Chengdu (CN)

(73) Assignee: IPGOAL MICROELECTRONICS (SICHUAN) CO., LTD., Chengdu (CN)

( * ) Notice: Subject to any disclaimer, the term of this patent is extended or adjusted under 35 U.S.C. 154(b) by 415 days.

(21) Appl. No.: 14/486,464

(22) Filed: Sep. 15, 2014

(65) Prior Publication Data

US 2015/0278151 A1 Oct. 1, 2015

(30) Foreign Application Priority Data

Mar. 25, 2014 (CN) .......................... 2014 1 0112035

(51) Int. Cl.
  *G06F 12/02* (2006.01)
  *G11C 16/20* (2006.01)
  *G11C 29/50* (2006.01)
  *G11C 29/04* (2006.01)

(52) U.S. Cl.
  CPC .......... *G06F 12/0246* (2013.01); *G11C 16/20* (2013.01); *G11C 29/50012* (2013.01); *G06F 2212/7203* (2013.01); *G11C 2029/0407* (2013.01)

(58) Field of Classification Search
  CPC ...... G06F 12/0246; G11C 16/20; G11C 13/42
  USPC ........................ 711/103, 154, 156, 158, 167; 365/185.33; 713/1, 2, 100
  See application file for complete search history.

(56) References Cited

U.S. PATENT DOCUMENTS

| | | | | |
|---|---|---|---|---|
| 6,272,628 | B1 * | 8/2001 | Aguilar | G06F 9/4401 713/2 |
| 6,289,449 | B1 * | 9/2001 | Aguilar | G06F 11/1417 713/2 |
| 6,470,457 | B1 * | 10/2002 | Brewer | G06F 1/26 713/2 |
| 6,784,797 | B2 * | 8/2004 | Smith | G08B 21/22 340/286.07 |
| 6,886,071 | B2 * | 4/2005 | Roohparvar | G11C 7/1045 711/103 |
| 7,010,643 | B2 * | 3/2006 | Roohparvar | G11C 7/1045 711/103 |

(Continued)

*Primary Examiner* — Stephen Elmore
(74) *Attorney, Agent, or Firm* — Shimokaji IP

(57) ABSTRACT

A start-up method for USB disk with synchronous flash memory includes steps of: (a) writing test data into a data cache zone of a flash memory according to an initiate read write clock of a flash memory controller; (b) reading the test data to a memory zone of a USB controller; (c) comparing the test data in two memory zones, and recording a comparison result and a phase parameter of read write clock; (d) delaying the initiate read write clock for one-unit delay, and repeating steps (a)~(d); (e) if the comparison result changes from success to failure, stopping repeat the step (d); (f) selecting the phase parameter of the read write clock that corresponds to one of the comparison results in an interval with multiple continuous successful comparison results to determine a clock phase for accessing the flash memory, and then starting up the USB flash disk. The method is quick and stable.

15 Claims, 2 Drawing Sheets

(56) References Cited

U.S. PATENT DOCUMENTS

| | | | | |
|---|---|---|---|---|
| 7,167,945 B2* | 1/2007 | Feldstein | ............. | H04M 11/066 |
| | | | | 711/103 |
| 7,257,667 B2* | 8/2007 | Roohparvar | ......... | G11C 7/1045 |
| | | | | 711/103 |
| 7,425,992 B2* | 9/2008 | Feeler | ................ | H04N 21/4432 |
| | | | | 348/552 |
| 8,214,616 B2* | 7/2012 | Ware | ................... | G06F 13/1684 |
| | | | | 711/104 |
| 8,359,445 B2* | 1/2013 | Ware | ................... | G06F 13/1684 |
| | | | | 710/125 |
| 8,395,951 B2* | 3/2013 | Ware | ................... | G06F 13/1684 |
| | | | | 365/189.011 |
| 8,462,566 B2* | 6/2013 | Ware | ................... | G06F 13/1684 |
| | | | | 365/156 |
| 8,537,601 B2* | 9/2013 | Ware | ................... | G06F 13/1684 |
| | | | | 365/149 |
| 8,625,371 B2* | 1/2014 | Ware | ................... | G06F 13/1684 |
| | | | | 365/189.04 |
| 8,717,837 B2* | 5/2014 | Ware | ................... | G06F 13/1684 |
| | | | | 365/191 |
| 8,760,944 B2* | 6/2014 | Ware | ................... | G06F 13/1684 |
| | | | | 365/189.04 |
| 9,053,778 B2* | 6/2015 | Ware | ................... | G06F 13/1684 |
| 9,367,107 B2* | 6/2016 | Maddigan | ................. | G06F 1/24 |
| 2003/0159076 A1* | 8/2003 | Delisle | ................... | G06F 1/3203 |
| | | | | 713/300 |
| 2011/0161726 A1* | 6/2011 | Swanson | ............... | G06F 11/073 |
| | | | | 714/6.12 |

* cited by examiner

START-UP METHOD FOR USB FLASH DISK WITH SYNCHRONOUS FLASH MEMORY AND CONTROL SYSTEM

RELATED APPLICATIONS

This application claims the benefit of priority to Chinese Patent Application No. 201410112035.4, filed on Mar. 25, 2014, which is hereby incorporated by reference in its entirety.

FIELD OF THE INVENTION

The present invention relates to technical field of USB storages and, more particularly to a start-up method for a USB flash disk with synchronous flash memory and a control system thereof.

BACKGROUND OF THE INVENTION

Software codes for a USB flash disk usually includes two portions one of which is firmware that is the program solidified in the USB controller chip ROM, and the other of which is the executable program stored in the RAM that can be modified. When a USB flash disk starts up, it's required to search configuration information in the flash memory and load the executable program to the RAM. As the plug-in flash memory in the USB flash disk is various, and their phase parameters of reading data are different, thus reading data in the flash memory reliably becomes quite critical.

Conventional solution is that the firmware accesses the flash memory with a low read write frequency (about 10 MHz). However, the current USB3.0 flash disk uses synchronous flash memory whose highest read write frequency reaches to 80 MHz, furthermore the capacity of the USB flash disk become larger and larger, thus it will spend longer time to search the flash memory by using the low read write frequency. Moreover, unreliability problem may appear to cause a failure on starting up the USB flash disk.

Therefore, there is a need for providing an improved start-up method for a USB flash disk with synchronous flash memory and a control system thereof to overcome the above-mentioned drawbacks.

SUMMARY OF THE INVENTION

One objective of the present invention is to provide a start-up method for a USB flash disk with synchronous flash memory and a control system thereof, thereby making full use of synchronous flash memory with higher working frequency, and eliminating differences among different types of synchronous flash memory chips and influence of PCB, so as to improve the start-up speed and stability for the USB flash disk.

To achieve the above-mentioned objectives, a start-up method for USB flash disk with synchronous flash memory includes steps of:

(a) writing test data of a firmware into a data cache zone of a flash memory according to an initiate read write clock of a flash memory controller;

(b) reading the test data from the data cache zone of the flash memory to a memory zone of a USB controller, according to the initiate read write clock;

(c) comparing the test data in the data cache zone of the flash memory with the test data in the memory zone of the USB controller, and recording a comparison result and a phase parameter of read write clock, with a successful comparison result showing the both test data are the same, a failure comparison result showing they are different;

(d) delaying the initiate read write clock of the flash memory controller for one-unit delay, and repeating steps (a)~(d);

(e) if the comparison result changes from success to failure, stopping repeat the step (d); and (f) selecting the phase parameter of the read write clock that corresponds to one of the comparison results in an interval with multiple continuous successful comparison results to determine a clock phase for accessing the flash memory, and then starting up the USB flash disk according to the clock phase.

Preferably, in the step (e), if at least two continuous comparison results present failure, stopping repeating the step (d).

Preferably, the step (f) includes selecting the phase parameter of the read write clock that corresponds to the one comparison result in the middle of the interval with multiple continuous successful comparison results to determine the clock phase for accessing the flash memory.

Preferably, the step (b) includes:

a frequency multiplier in the USB controller outputting a low frequency clock to the flash memory controller, the low frequency clock serving as the initial read write clock of the flash memory controller; and outputting a high frequency clock to a delay circuit in the USB controller, to set delay condition for a DQS outputted by the flash memory controller; and a data flip-latch sampling test data outputted by the flash memory controller according to a delayed DQS, and inputting the test data that is sampled to the memory zone of the USB controller.

Preferably, according to the high frequency clock, the delay circuit delays the DQS for one-unit delay at least and then outputs the delayed DQS to the data flip-latch, and the one-unit delay is one period of the high frequency clock, Preferably, in the step (f), if the amount of the comparison results in the interval is an odd number, selecting the phase parameter of the read write clock that corresponds to the middle comparison result in the interval to determine the clock phase for accessing the flash memory; otherwise, selecting the phase parameter of the read write clock that corresponds to either of two middle comparisons in the interval to determine the clock phase for accessing the flash memory.

Preferably, it further includes step (j), if the interval is larger than an upper limit of a predetermined interval, increasing the frequency of the initial read write clock of the flash memory controller, and repeating the steps (a) to (f).

Preferably, it further includes repeating the step (j), until the interval is equal to or smaller than the upper limit of the predetermined interval.

Accordingly, a control system of USB flash disk with synchronous flash memory, adapted for reading flash memory data to a memory zone of a USB controller, includes a frequency multiplier, a delay circuit, and a data flip-latch, with the frequency multiplier outputting a high frequency clock and a low frequency clock respectively, the low frequency clock being inputted to a flash memory controller to serve as an initial read write clock of the flash memory controller, the high frequency clock being inputted to the delay circuit; the flash memory controller outputting a data sampling pulse to the delay circuit according to the low frequency clock, the delay circuit delaying the data sampling pulse for at least one-unit delay according to the high frequency clock to output a delayed data sampling pulse to the data flip-latch; and the flash memory controller outputting test data in data cache zone to the data flip-latch according to the low frequency clock, and then the data flip-latch sampling the test data according to the delayed data sampling pulse and inputting the test data that is sampled to the memory zone of the USB controller.

Preferably, the one-unit delay is one period of the high frequency clock.

In comparison with the prior art, when the USB flash disk is going to be started up, without changing the data prestored in the flash memory, the test data is written into the data cache zone of the flash memory under different read write clock phases, and then read to the memory zone of the USB controller, and the test data in the two memory zones will be compared by the firmware to calibrate the phase, so as to select the best read write clock phase. After the parameter of the read write clock phase with that a stable reading and writing operation can be performed is obtained, the flash memory is accessed normally. In such a way, the synchronous flash memory with higher working frequency can be made full use, and difference among different types of synchronous flash memory chips and influence of PCB are eliminated, thereby improving the start-up speed and stability for the USB flash disk.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
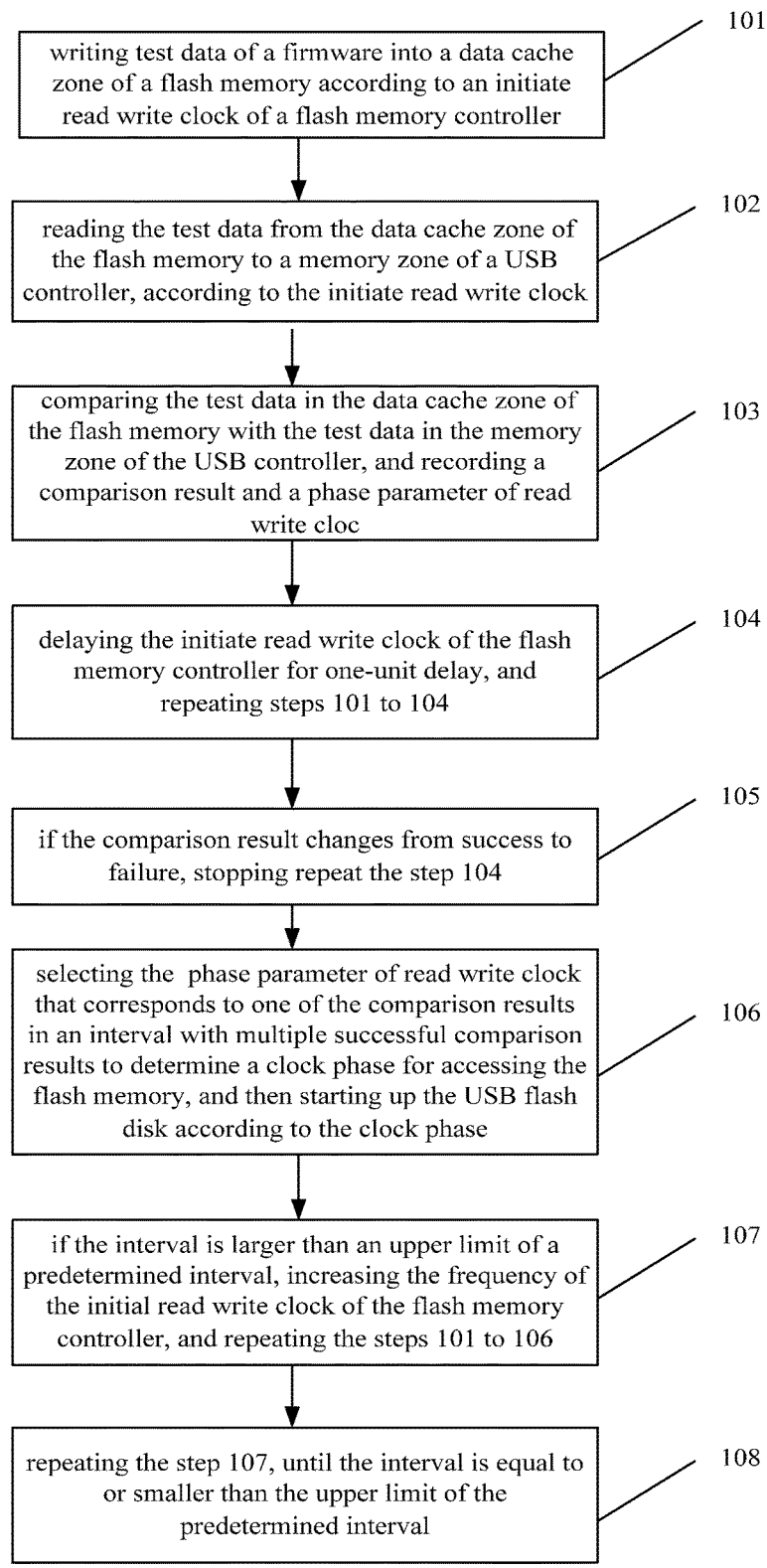
FIG. 1 is a flowchart of a start-up method for USB flash disk with synchronous flash memory according to one embodiment of the present invention.

Various preferred embodiments of the invention will now be described with reference to the figures, wherein like reference numerals designate similar parts throughout the various views. As indicated above, the invention is directed to a start-up method for a USB flash disk with synchronous flash memory and a control system thereof, thereby making full use of synchronous flash memory with higher working frequency, and eliminating difference among different types of synchronous flash memory chips and influence of PCB, so as to improve the start-up speed and stability for the USB flash disk.

Figure 2:
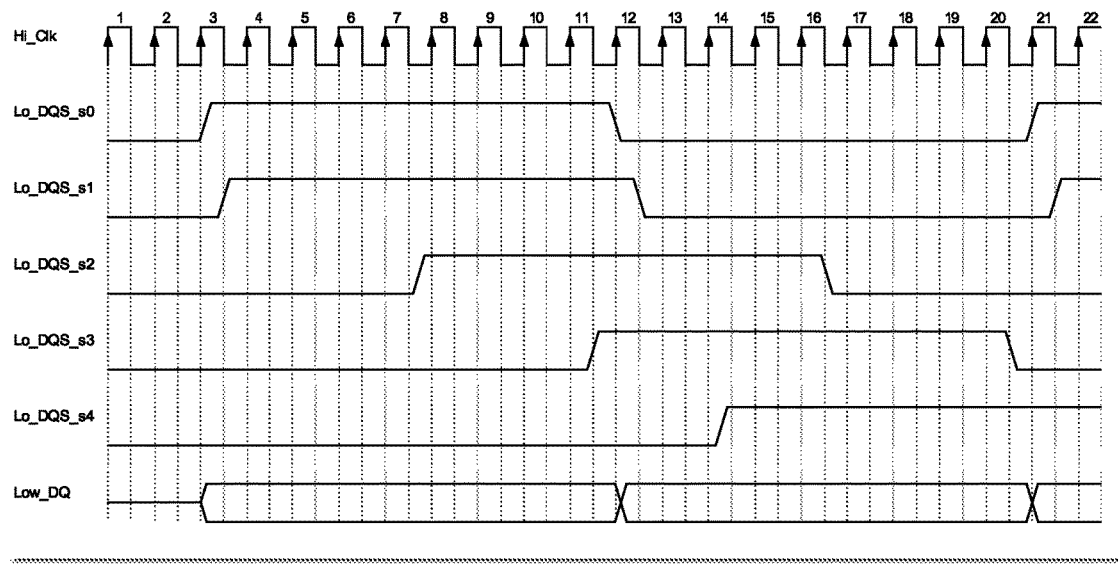
FIG. 2 is a time sequence chart of phase calibration by using the start-up method for USB flash disk with synchronous flash memory according to present invention.
Figure 3:
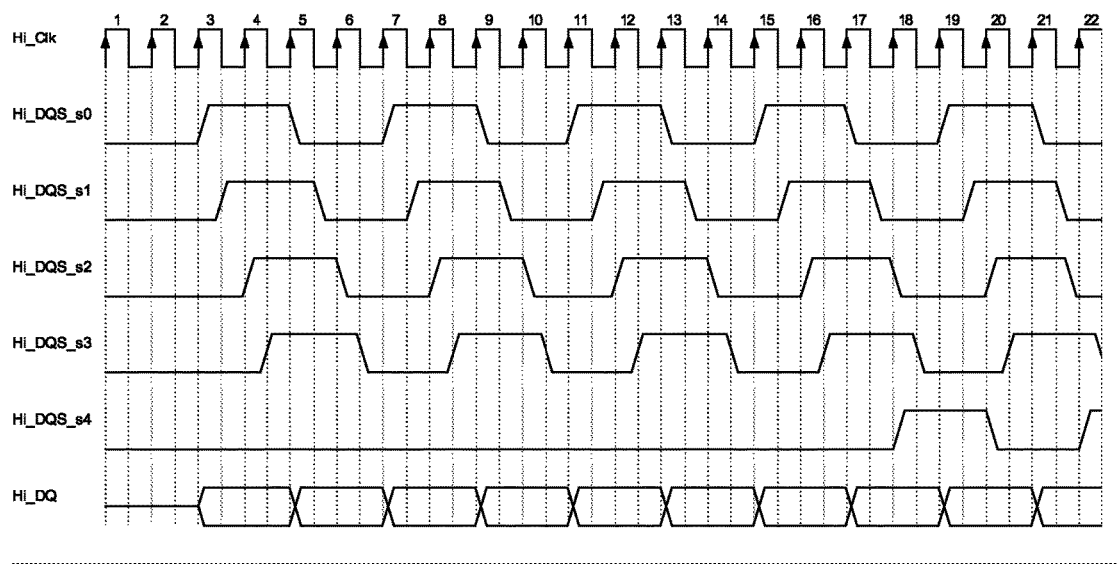
FIG. 3 is another time sequence chart of phase calibration by using the start-up method for USB flash disk with synchronous flash memory according to present invention.

Referring to FIGS. 1-3, the start-up method of USB flash disk with synchronous flash memory is described. As shown, the method includes the following steps.

Step 101, writing test data of a firmware into a data cache zone of a flash memory according to an initiate read write clock of a flash memory controller. In the present step, the initiate read write clock of the flash memory controller is provided by the USB controller system, and whose frequency is a low frequency clock which is merely one tenth of the highest read write frequency for synchronous flash memory. Such a frequency may ensure reliable data reading even if it is delayed for multiple times. In addition, since the data written into is the test data, and no flash memory program is started at this time, thus the test data will not impact other data stored in the flash memory.

Step 102, reading the test data from the data cache zone of the flash memory to a memory zone of a USB controller, according to the initiate read write clock. Specifically, in this step, a frequency multiplier (phase locked loop, PLL) in the USB controller outputs the low frequency clock to the flash memory controller, and this low frequency clock is served as the initiate read write clock (referring to Lo_DQS_S0 in the FIG. 2) for the flash memory controller, thus the frequency of the initiate read write clock of the flash memory controller can be set by adjusting the PLL in the actual practice. After that, the flash memory controller outputs a data sampling pulse (DQS) to a delay circuit in the USB controller according to the low frequency clock, and the PLL output a high frequency clock (referring to Hi_Clk in the FIG. 2) to the delay circuit, so as to set the delay item for the DQS outputted by the flash memory controller. And then, the delay circuit inputs the delayed DQS to a data flip-latch in the USB controller which will sample the test data outputted from the flash data cache zone accordingly and then output the test data that is sampled to the memory zone of the USB controller. In addition, as known, the data reading characteristics for the synchronous flash memory is that, data sampling will be carried out at both rising edges and falling edges of the DQS. The initiate phase outputted by the synchronous flash memory data is shown as "Lo_DQS" (therein no delay happens to the DQS) in the FIG. 2, by this token, the DQS and the test data DQ (that is the Low_DQ shown in FIG. 2) are risen and fallen synchronously. For reading the DQ reliably, the DQS will be delayed to adjust its rising edges and falling edges to be located at the middle position of two adjacent test data, as shown in the Low_DQS_S2 in FIG. 2, so that the test data can be sampled stably. Further, in the present step, the delay circuit performs to delay the DQS for at least one-unit delay according to the high-frequency clock, and the one-unit delay is one period for the high-frequency clock.

Step 103, comparing the test data in the data cache zone of the flash memory with the test data in the memory zone of the USB controller, and recording a comparison result and a phase parameter of read write clock. In this step, the firmware will compare the test data in the two memories, if they are the same, then the comparison is successful, which is recorded as "S", and the phase parameter of the delayed DQS is recorded at the same time; if they are different, then the comparison is failed, which is recorded as "F". Concretely, when the sampling position happened to the DQ satisfies the setup/hold time for reading data, the DQS can sample the DQ correctly, that is, the test data comparison is successful (two test data are the same).

Step 104, delaying the initiate read write clock of the flash memory controller for one-unit delay, and repeating steps 101~104. In this step, through the delay circuit in the USB controller, the DQS is delayed for one-unit delay based on the previous one, one by one, (as shown in FIG. 2, Lo_DQS_S1 is delayed for one-unit delay based on Lo_DQS_S0, similarly, other clocks Lo_DQS_S2, Lo_DQS_S3, Lo_DQS_S4 are delayed for one-unit delay with respect to its previous one respectively), and the steps 101~104 are repeated, so that the DQS can sample the DQ correctly, namely test data comparison can be successful. At the beginning, it's usual that the sampling position happened to the DQ may not satisfy the setup/hold time for reading data, thus the correct phase for sampling DQ can be calibrated by delaying the DQS. In addition, after repeating steps 101 to 104 for multiple times, a comparison result table showing successful comparison (labeled as S) and failed comparison (labeled as F) is illustrated in table 1 as following.

TABLE 1

| F | F | F | F | F | S | S | S | S | S | F | F | F | F | F | F |
|---|---|---|---|---|---|---|---|---|---|---|---|---|---|---|---|

Step 105, if the comparison result changes from success to failure, stopping repeat the step 104. In such a way, the delay amount for the DQS is increased continuously. Due to the sampling position for the DQ still satisfies the setup/hold time for reading data, thus it's reliable to read data which leads to a successful comparison to obtain an interval with multiple continuous successful comparison results, as shown in the interval labeled with S. Until several delay units are added to the DQS (as shown the Lo_DQS_S4 in FIG. 2), the setup/hold time requirement is not satisfied no longer, it means that it's unreliable to read data to cause a failed comparison. Therefore, the interval with continuous successful comparison results "S" is ended, it's unnecessary to delay the DQS any more, that is, the step 104 is stopped repeating. However, for preventing some unexpected instants and ensuring the veracity of the comparison results, in a modified embodiment of the present invention, the stopping of delaying the DQS will be performed after two failed comparison results "F" appears. Of course, it's allowable to extend the F interval, but a longer running time will be spent.

Step 106, selecting the phase parameter of the read write clock that corresponds to one of the comparison results in an interval with multiple successful comparison results to determine a clock phase for accessing the flash memory, and then starting up the USB flash disk according to the clock phase. In this step, if the frequency of the read write clock is lower, the time of successful comparison between two test data will be more, and the amount of the label "S" indicates the reliable sampling window size of test data, that is, the phase of the corresponding DQS is shown as the interval from Lo_DQS_S1 to Lo_DQS_S3, therein the sampling window size will be larger if the parameters of the DQS are more, but only one DQS parameter will be selected as the best phase. In a preferred embodiment, it's preferred to select the phase parameter of the read write clock corresponding to the comparison result in the middle of the interval with continuous label S as the clock phase to access the flash memory, so as to ensure the stable data reading, minimize the error, and start up the USB disk quickly. Additionally, in practice, the size of the interval with continuous label S is different in different situations, namely the amount of the label S in the table 1 is different. If the amount of the label S is an odd number, the phase parameter of the read write clock that corresponds to the middle one in the interval will be selected, to determine the clock phase for accessing; if the amount of the label S is an even number, the phase parameter of the read write clock that corresponds to either of two middle results in the interval will be selected, to determine the clock phase for accessing.

In such a way, multiple comparison tests are performed to the test data in two memory zones with different read write clocks, thus the best phase can be selected to start up the USB disk quickly and stably, thereby making full use of synchronous flash memory with higher working frequency, and eliminating difference among different types of synchronous flash memory chips and influence of PCB, etc.

As well known, if the frequency of read write clock is lower, the reliable sampling window will be broader; accordingly, if the clock frequency is higher, the reliable sampling window will be narrower, but either too broad or too narrow reliable sampling window may go against selecting a suitable DQS phase.

In a preferred embodiment, the method further includes the following steps.

Step 107, if the interval is larger than an upper limit of a predetermined interval, increasing the frequency of the initial read write clock of the flash memory controller, and repeating the steps 101 to 106. In this step, the size of the predetermined interval may be set according to actual demand, which is omitted here. If the amount of the continuous label S is larger than the upper limit of the predetermined interval, it's viable to adjust PLL to increase the frequency of the initial read write clock of the flash controller, and repeat the steps 101 to 106, so that the amount of the continuous label S is within the predetermined interval. Referring to FIG. 3, Hi_Clk shows the high frequency clock outputted by the PLL, Hi_DQS_S0 shows the initial read write clock, Hi_DQS_S1 to Hi_DQS_S4 respectively shows clocks that are delayed for one-unit delay based on the Hi_DQS_S0, one by one, therein Hi_DQ shows the test data.

Step 108, repeating the step 107, until the interval is equal to or smaller than the upper limit of the predetermined interval. If the initial read write clock frequency is too lower and the frequency increment for one time is too small, it's hard to make the amount of the continuous label S within the predetermined interval by increasing the frequency increment for one time. Therefore, in this step, repeating the step 107 can ensure the amount of the continuous label S be within the predetermined interval, that is because the frequency of the initial read write clock will be increased continually by repeating the step 107, causing the amount of the continuous label S reduce continually, and the step 107 will be stopped if the amount of the continuous label S is reduced to be smaller than or equal to the upper limit of the interval. In such a way, for all initial read write clock frequencies, the continuous label S can be located in the predetermined interval.

Figure 4:
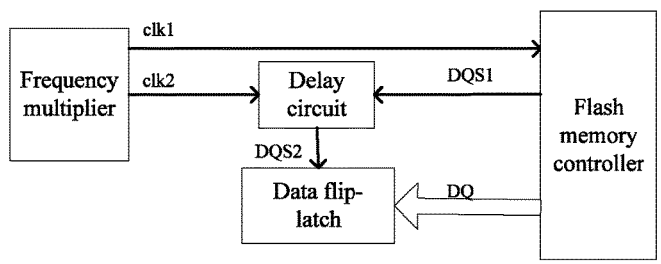
FIG. 4 is a block diagram of a control system of USB flash disk with synchronous flash memory according to one embodiment of the present invention.

Referring to FIG. 4 again, it shows a block diagram of a control system of USB flash disk with synchronous flash memory according to the present invention. Concretely, the control system is adapted for reading flash memory data to a memory zone of a USB controller, which includes a frequency multiplier, a delay circuit, and a data flip-latch. Specifically, the frequency multiplier outputs a high frequency clock clk2 and a low frequency clock clk1 respectively, the low frequency clock clk1 is inputted to the flash memory controller to serve as an initial read write clock of the flash memory controller, and the high frequency clock clk2 is inputted to the delay circuit. The flash memory controller outputs a data sampling pulse DQS1 to the delay circuit according to the low frequency clock clk1, and then the delay circuit delays the data sampling pulse DQS1 for at least one-unit delay according to the high frequency clock clk2 to output a delayed data sampling pulse DQS2 to the data flip-latch, after that, the flash memory controller outputs test data in data cache zone to the data flip-latch according to the low frequency clock clk1, and then the data flip-latch samples the test data according to the delayed data sampling pulse DQS2 and inputs the test data that is sampled to the memory zone of the USB controller. Concretely, the one-unit delay is one period of the high frequency clock. In the present invention, multiple delays are performed to the data sampling pulse DQS1, until the rising edges and the falling edges of the delayed data sampling pulse DQS2 are located in the middle position of the two test data DQ respectively, thus the test data DQ can be read reliably, and the phase of the delayed data sampling pulse DQS2 can be calibrated, thereby starting up the USB flash disk quickly and stably.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A start-up method for USB flash disk with synchronous flash memory, comprising steps of:
    (a) writing test data of a firmware into a data cache zone of a flash memory according to an initiate read write clock of a flash memory controller;
    (b) reading the test data from the data cache zone of the flash memory to a memory zone of a USB controller, according to the initiate read write clock;
    (c) comparing the test data in the data cache zone of the flash memory with the test data in the memory zone of the USB controller, and recording a comparison result and a phase parameter of read write clock, with a successful comparison result showing the both test data are the same, a failure comparison result showing they are different;
    (d) delaying the initiate read write clock of the flash memory controller for one-unit delay, and repeating steps (a)~(d);
    (e) if the comparison result changes from success to failure, stopping repeat the step (d); and
    (f) selecting the phase parameter of the read write clock that corresponds to one of the comparison results in an interval with multiple continuous successful comparison results to determine a clock phase for accessing the flash memory, and then starting up the USB flash disk according to the clock phase.

2. The method according to claim 1, in the step (e), if at least two continuous comparison results present failure, stopping repeating the step (d).

3. The method according to claim 2, wherein the step (f) comprises:
    selecting the phase parameter of the read write clock that corresponds to the one comparison result in the middle of the interval with multiple continuous successful comparison results to determine the clock phase for accessing the flash memory.

4. The method according to claim 3, wherein the step (b) comprises:
    a frequency multiplier in the USB controller outputting a low frequency clock to the flash memory controller, the low frequency clock serving as the initial read write clock of the flash memory controller; and outputting a high frequency clock to a delay circuit in the USB controller, to set delay condition for a DQS outputted by the flash memory controller; and
    a data flip-latch sampling test data outputted by the flash memory controller according to a delayed DQS, and inputting the test data that is sampled to the memory zone of the USB controller.

5. The method according to claim 4, wherein according to the high frequency clock, the delay circuit delays the DQS for one-unit delay at least and then outputs the delayed DQS to the data flip-latch, and the one-unit delay is one period of the high frequency clock.

6. The method according to claim 1, in the step (f), if the amount of the comparison results in the interval is an odd number, selecting the phase parameter of the read write clock that corresponds to the middle comparison result in the interval to determine the clock phase for accessing the flash memory; otherwise, selecting the phase parameter of the read write clock that corresponds to either of two middle comparisons in the interval to determine the clock phase for accessing the flash memory.

7. The method according to claim 1, further comprising:
    step (j), if the interval is larger than an upper limit of a predetermined interval, increasing the frequency of the initial read write clock of the flash memory controller, and repeating the steps (a) to (f).

8. The method according to claim 2, further comprising:
    step (j), if the interval is larger than an upper limit of a predetermined interval, increasing the frequency of the initial read write clock of the flash memory controller, and repeating the steps (a) to (f).

9. The method according to claim 3, further comprising:
    step (j), if the interval is larger than an upper limit of a predetermined interval, increasing the frequency of the initial read write clock of the flash memory controller, and repeating the steps (a) to (f).

10. The method according to claim 4, further comprising:
    step (j), if the interval is larger than an upper limit of a predetermined interval, increasing the frequency of the initial read write clock of the flash memory controller, and repeating the steps (a) to (f).

11. The method according to claim 5, further comprising:
    step (j), if the interval is larger than an upper limit of a predetermined interval, increasing the frequency of the initial read write clock of the flash memory controller, and repeating the steps (a) to (f).

12. The method according to claim 6, further comprising:
    step (j), if the interval is larger than an upper limit of a predetermined interval, increasing the frequency of the initial read write clock of the flash memory controller, and repeating the steps (a) to (f).

13. The method according to claim 7, further comprising:
    repeating the step (j), until the interval is equal to or smaller than the upper limit of the predetermined interval.

14. A control system of USB flash disk with synchronous flash memory, adapted for reading flash memory data to a memory zone of a USB controller, comprising a frequency multiplier, a delay circuit, and a data flip-latch;
    the frequency multiplier outputting a high frequency clock and a low frequency clock respectively, the low frequency clock being inputted to a flash memory controller to serve as an initial read write clock of the flash memory controller, the high frequency clock being inputted to the delay circuit;
    the flash memory controller outputting a data sampling pulse to the delay circuit according to the low frequency clock, the delay circuit delaying the data sampling pulse for at least one-unit delay according to the high frequency clock to output a delayed data sampling pulse to the data flip-latch; and the flash memory controller outputting test data in data cache zone to the data flip-latch according to the low frequency clock, and then the data flip-latch sampling the test data according to the delayed data sampling pulse and inputting the test data that is sampled to the memory zone of the USB controller.

15. The control system according to claim 14, wherein the one-unit delay is one period of the high frequency clock.

* * * * *